United States Patent [19]
Chang et al.

[11] Patent Number: 5,580,806
[45] Date of Patent: Dec. 3, 1996

[54] METHOD OF FABRICATING A BURIED CONTACT STRUCTURE FOR SRAM

[75] Inventors: Tsun-Tsai Chang; Ming-Tsung Liu, both of Hsinchu, Taiwan

[73] Assignee: United Microelectronics Corp., Hsinchu, Taiwan

[21] Appl. No.: 369,727

[22] Filed: Jan. 6, 1995

[51] Int. Cl.$^6$ ............ H01L 21/441; H01L 21/8244
[52] U.S. Cl. .............. 437/44; 437/52; 437/200; 148/DIG. 19
[58] Field of Search ............... 437/44, 52, 195, 437/200; 148/DIG. 19; 257/903–904

[56] References Cited

U.S. PATENT DOCUMENTS

| | | | |
|---|---|---|---|
| 4,746,219 | 5/1988 | Holloway et al. | 357/23.11 |
| 5,234,856 | 8/1993 | Gonzalez | 437/47 |
| 5,372,956 | 12/1994 | Baldi | 437/34 |

FOREIGN PATENT DOCUMENTS 61-177716A  8/1986  Japan .................... 437/200

Primary Examiner—Mary Wilczewski
Assistant Examiner—Richard A. Booth
Attorney, Agent, or Firm—Ladas & Parry

[57] ABSTRACT

A buried contact structure formed on a semiconductor substrate. A single polysilicon layer is formed on a field oxide layer. The polysilicon layer is patterned and etched to form an interconnect layer. A silicide layer is formed on the sidewall of the interconnect layer. The silicide layer connects a buried contact region with the interconnect layer to make electrical contact between the interconnect layer and a source/drain region.

8 Claims, 5 Drawing Sheets

METHOD OF FABRICATING A BURIED CONTACT STRUCTURE FOR SRAM

BACKGROUND OF THE INVENTION

1. Field of the Invention

The present invention relates to a method of fabricating a buried contact structure used in MOS and bipolar (including BiMOS or BiCMOS) semiconductor devices, and more particularly to a method of fabricating a buried contact structure by forming a silicide layer on the sidewall of the interconnect layer of the semiconductor devices to make electrical contact with the source/drain regions.

2. Description of the Related Art

Buried contacts have been extensively used in MOS memory integrated circuits. For example, buried contacts are used in a MOS SRAM (static random-access memory) cell, which employs two loads (active load or passive load) and two cross-coupled MOS transistors, to connect each gate electrode to the drain region of the opposing cross-coupled MOS transistors. In a typical memory cell architecture, the buried contacts are also electrically connected to source/drain regions of MOS transistors, which form transmission-gates to provide data path into or out of the memory cell. Consequently, buried contacts provide electrical interconnection among gate electrodes, drain regions of the cross-coupled MOS transistors and source/drain regions of the transmission-gate transistors.

A conventional process for the formation of buried contacts is illustrated in FIGS. 1A through 1F. First referring to FIG. 1A, field oxide 100 is first formed on P-type semiconductor substrate 1, such as the LOCOS (local oxide of silicon) method. Field oxide 100 serves as an isolation layer. Then, a gate oxide layer 10 is formed over the surface of the substrate 1 not covered by field oxide 100. First polysilicon layer 12A is then deposited on field oxide 100 and gate oxide layer 10.

Referring next to FIG. 1B, first polysilicon layer 12A and gate oxide layer 10 are then patterned and etched to form opening 102 to expose a portion of substrate 1.

Referring to FIG. 1C, second polysilicon layer 12B is then conformably deposited over exposed substrate 1 at opening 102 and first polysilicon layer 12A.

Referring to FIG. 1C and FIG. 1D, second polysilicon layer 12B and first polysilicon layer 12A are thereafter patterned and etched to define transistor gate electrode 13 and interconnect layer 12. Note that trench 104 will be inevitably formed in substrate 1 during the etching process used to define gate electrode 13 and interconnect layer 12. It is noted that the ratio of etch rates of different materials is known as the selectivity of an etch process. Since there is poor substrate/polysilicon etch selectivity, no gate oxide layer 10 is provided within the region of opening 102 as an etching stop, and the reactive ion etch gases used to etch polysilicon layers 12A and 12B also etch the single crystal silicon substrate 1 at about the same rate. After that, thin oxide layer 106 with a thickness of 50–500Å is formed on all of the surface to serve as a passivation layer during the subsequent implantation process. Then, a N-type ion implantation is applied to create N-type lightly-doped region 14 in substrate 1.

Referring now to FIG. 1E, by chemical vapor deposition, a CVD oxide layer is deposited onto the overall surface and combines with the thin oxide layer 106 to form a oxide layer 108. The thickness of CVD oxide layer is about 2500Å to 3000Å.

Finally, referring to FIG. 1F, oxide layer 108 is then removed by etch back process. Note that spacers 108 remain on the side walls of gate electrode 13 and interconnect layer 12 after the etch back process. Next, another N-type ion implantation, which uses a higher implantation dose than that used for forming lightly-doped region 14, is applied to form N-type heavily-doped region 16 in substrate 1 to finish the process. The resulting structure as depicted in FIG. 1F is a conventional buried contact structure, wherein the marked area 107 is a contact region.

However, the conventional buried contact structure makes use of the interconnect layer 12 extending over the a portion of the N-type heavily-doped region 16 to make electrical contact through the contact region 107. This become a disadvantage in the scaling down of dimensions of semiconductor devices. The complicated process for the formation of a buried contact structure is another problem. Moreover, the inevitably formed trench 104 will make spacer 108 within opening 102 become thicker, thus reducing the dosage of impurities implanted in the underlying heavily-doped region 16. This accordingly increases the resistance and thus induces the resistance deviation of the heavily-doped region 16. Trench 104 will also result in poor step coverage in the subsequent process steps, for example in the deposition of pre-metal dielectric layer such as BPSG (borophosphosilicate glass), thus reducing the reliability of the resulting semiconductor devices.

SUMMARY OF THE INVENTION

It is therefore an object of the invention to provide a method of fabricating a buried contact structure, such that the above mentioned disadvantages can be eliminated.

The above object of the invention is attained by providing a single polysilicon layer on a field oxide layer. The polysilicon layer is then patterned and etched to form the interconnect layer. A silicide layer is then formed on the sidewall of the interconnect layer. The silicide layer connects a buried contact region with the interconnect layer to make electrical contact between the interconnect layer and a source/drain region.

Specifically, the buried contact structure of the invention is fabricated as follows. A silicon semiconductor substrate doped with impurities of a first conductivity type and having an active region isolated by a field oxide layer is provided. A gate oxide layer is formed over the field oxide layer and the substrate. A polysilicon layer is formed over the gate oxide layer. The polysilicon layer is patterned and etched to form a gate electrode on the active region, an interconnect layer covering the field oxide layer, and an opening is disposed between the gate electrode and the interconnect layer, the interconnect layer having a sidewall adjacent to the opening. Impurities of a second conductivity type are implanted through the opening into the substrate to form a heavily-doped source/drain region beneath the opening. A silicide layer is formed on the sidewall of the interconnect layer to make electrical contact with the heavily-doped source/drain region.

Other objects, features and advantages of the invention will become more apparent by way of the following detailed description of the preferred but non-limiting embodiment.

BRIEF DESCRIPTION OF THE DRAWINGS

The detailed description of the preferred embodiment of the invention is made with reference to the accompanying drawings, wherein.

DETAILED DESCRIPTION OF THE INVENTION

Referring to FIGS. 2A–2E, these drawings show the steps of fabricating a buried contact structure on P-type substrate 2 according to the present invention. The specific process steps are now described below.

Figure 1A:
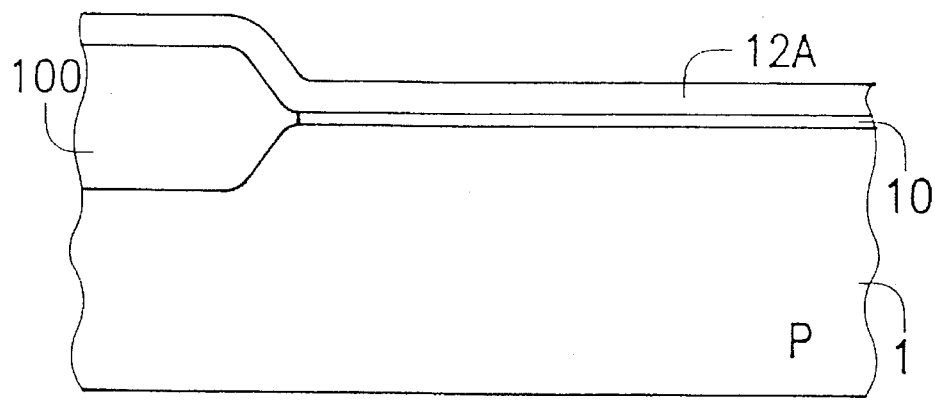
FIGS. 1A–1F show in cross-sectional views the conventional method of fabricating a buried contact structure on a semiconductor substrate.
Figure 1B:
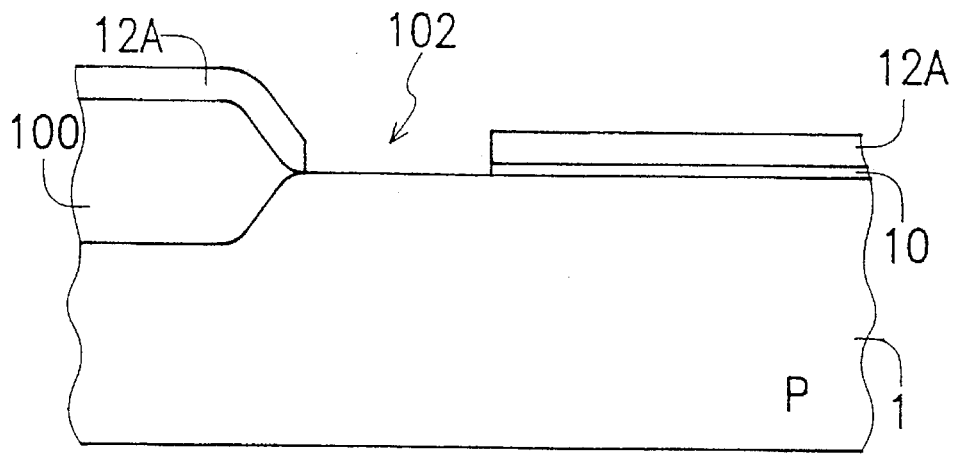
Figure 1C:
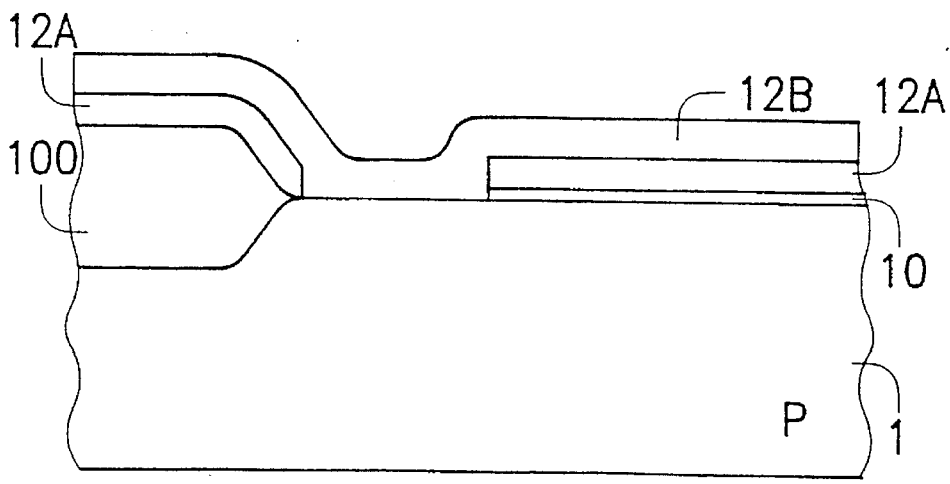
Figure 1D:
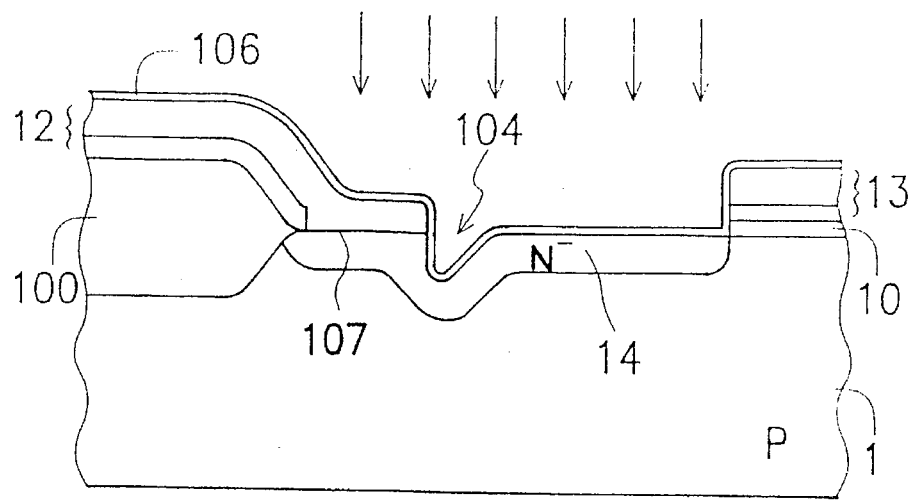
Figure 1E:
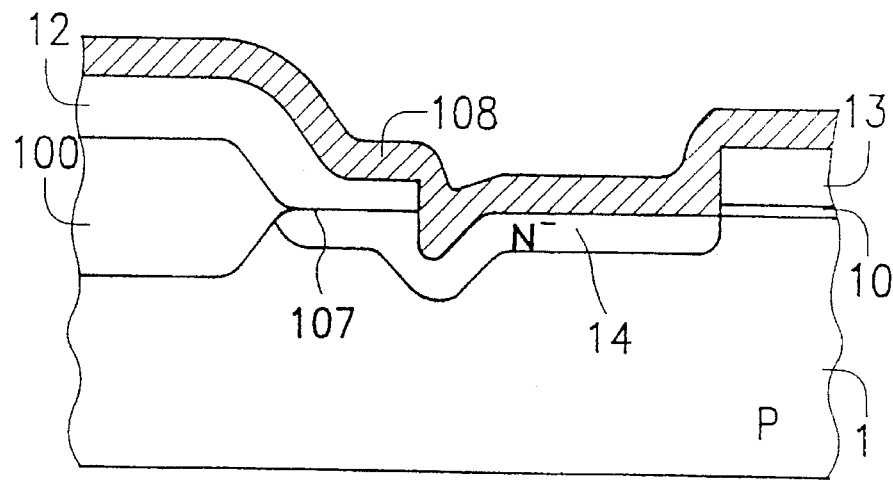
Figure 1F:
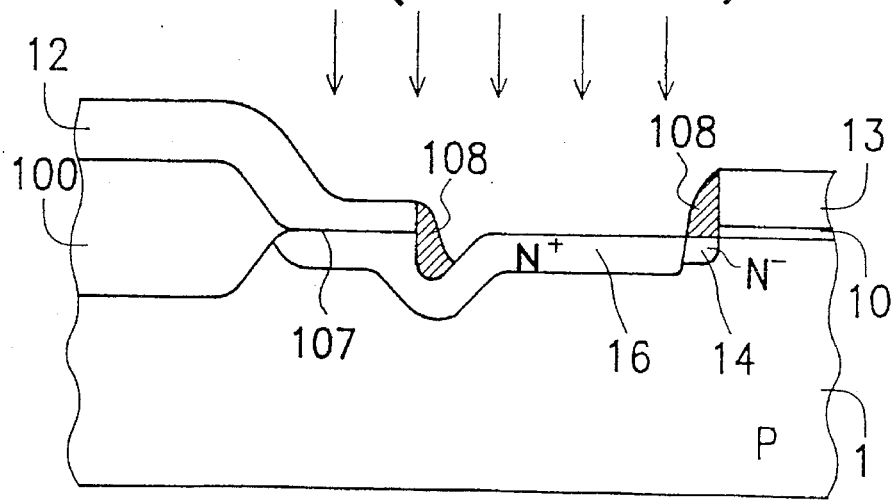
Figure 2A:
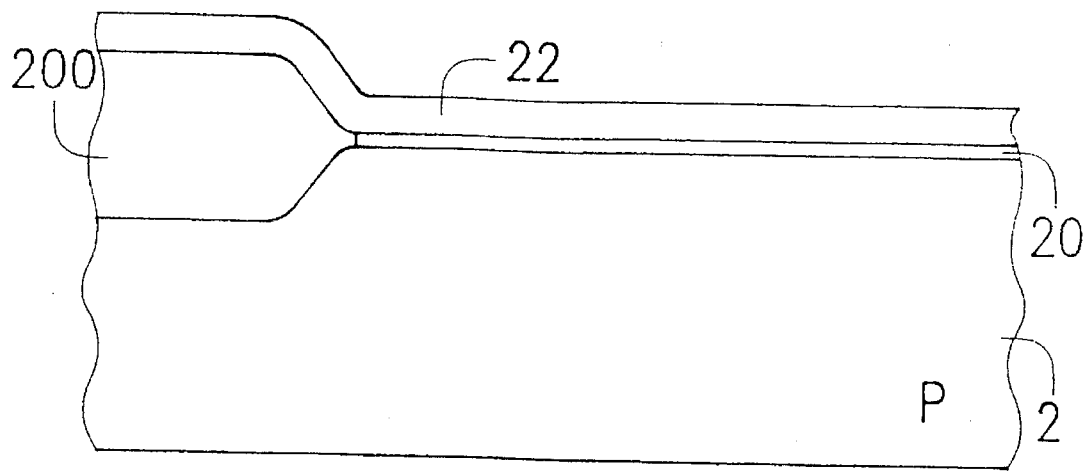
FIGS. 2A–2E show in cross-sectional views the method of fabricating a buried contact structure on a semiconductor substrate in accordance with the preferred embodiment of the invention.

Referring to FIG. 2A, field oxide 200 is formed on substrate 2 by the conventional LOCOS method. Field oxide 200 serves as an isolation layer. Then, gate oxide layer 20 is formed over the surface of the substrate 2. Polysilicon layer 22 is then deposited on field oxide 200 and gate oxide layer 20. To increase the conductivity, optionally, a tungsten silicide layer (not shown) can be formed on polysilicon layer 22.

Figure 2B:
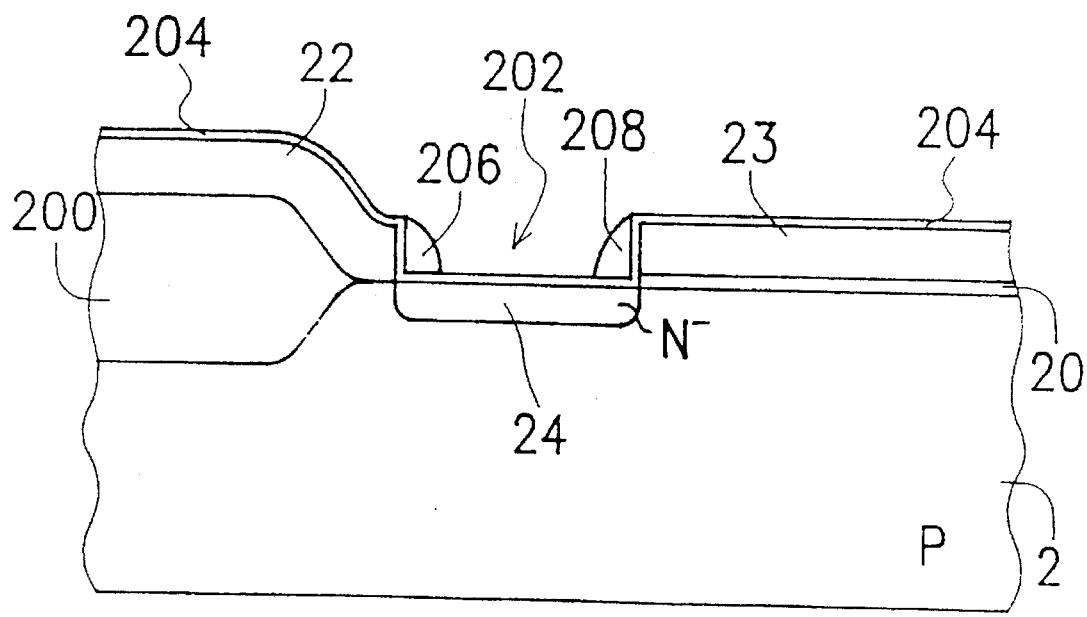

Referring next to FIG. 2B, polysilicon layer 22 and gate oxide layer 20 are then patterned and etched to form opening 202 to expose a portion of substrate 2, and meanwhile define gate electrode 23 and interconnect layer 22. Thin oxide layer 204 with a thickness of 50–500Å is thereafter formed on the surface of polysilicon layer 22, gate electrode 23 and the exposed substrate, i.e. opening 202. Subsequently, an N-type ion implantation is applied to form N-type lightly-doped region 24 in substrate 2 through opening 202. Next, atmospheric pressure chemical vapor deposition (APCVD) is applied to deposit a CVD oxide with a thickness of 2500Å over the entire surface, followed by an etch back process. First spacer 206 and second spacer 208 are formed on the sidewalls of interconnect layer 22 and gate electrode 23, respectively.

Figure 2C:
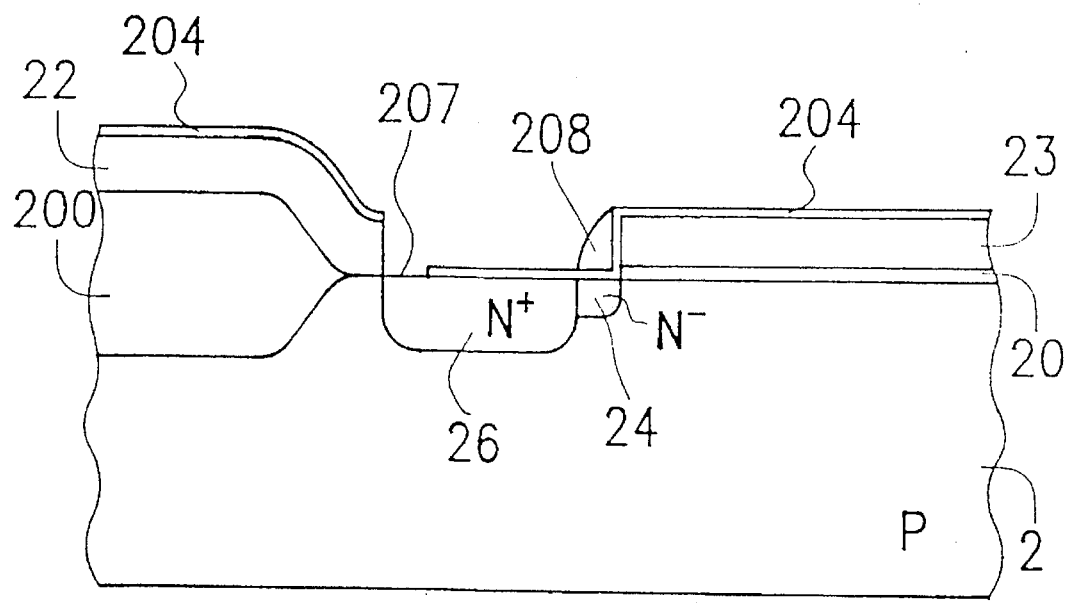

Referring to FIG. 2C, first spacer 206 together with thin oxide layer 204 formed on the sidewall of interconnect layer 22 and beneath first spacer 206 are then removed by a lithography technique and etching process. Note that the underlying region of the removed first spacer 206 is contact region 207. Another N-type ion implantation is then applied to form N-type heavily-doped region 26 in substrate 2.

Figure 2D:
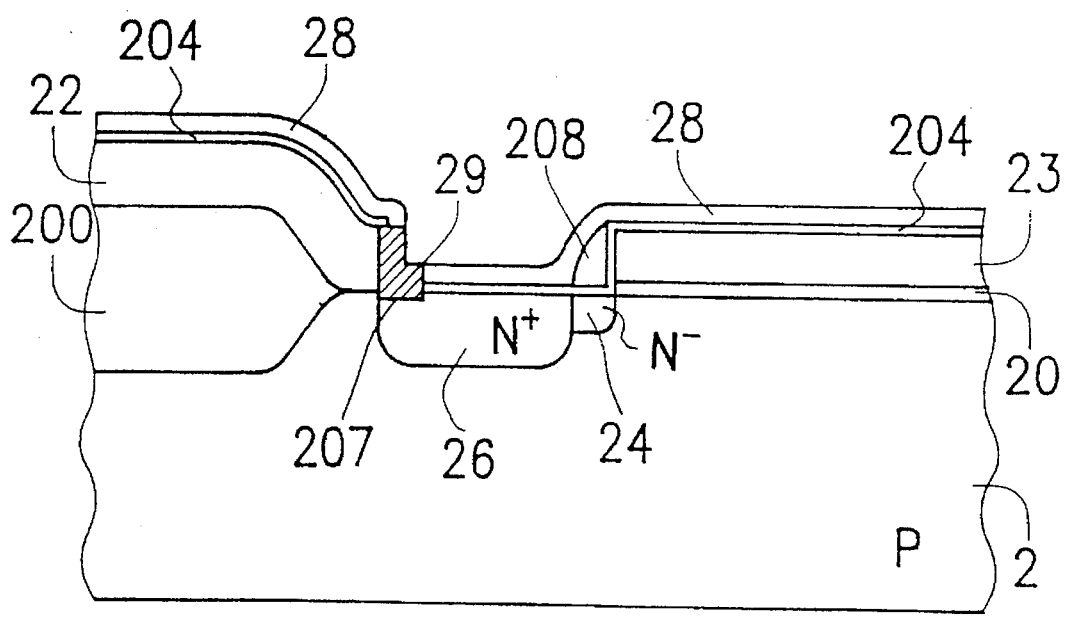

Referring now to FIG. 2D, metal layer 28 (e.g., titanium) with a thickness of 500Å to 1500Å is deposited on the overall surface, therefore, to contact the N-type heavily-doped region 26 through the contact region 207, sidewall of the interconnect layer 22, thin oxide layer 204, and second spacer 208. The resulting structure is then subjected to anneal at a temperature of about 800° C. As a result, metal layer 28 contacting with the sidewall of interconnect layer 22 and contact region 207 respectively reacts with heavily-doped region 26 and interconnect layer 22 to form silicide layer 29 (e.g., titanium silicide). Silicide layer 29 connects contact region 207 with interconnect layer 22 to make electrical contact with heavily-doped region 26 which forms source/drain regions of the final semiconductor device.

Figure 2E:
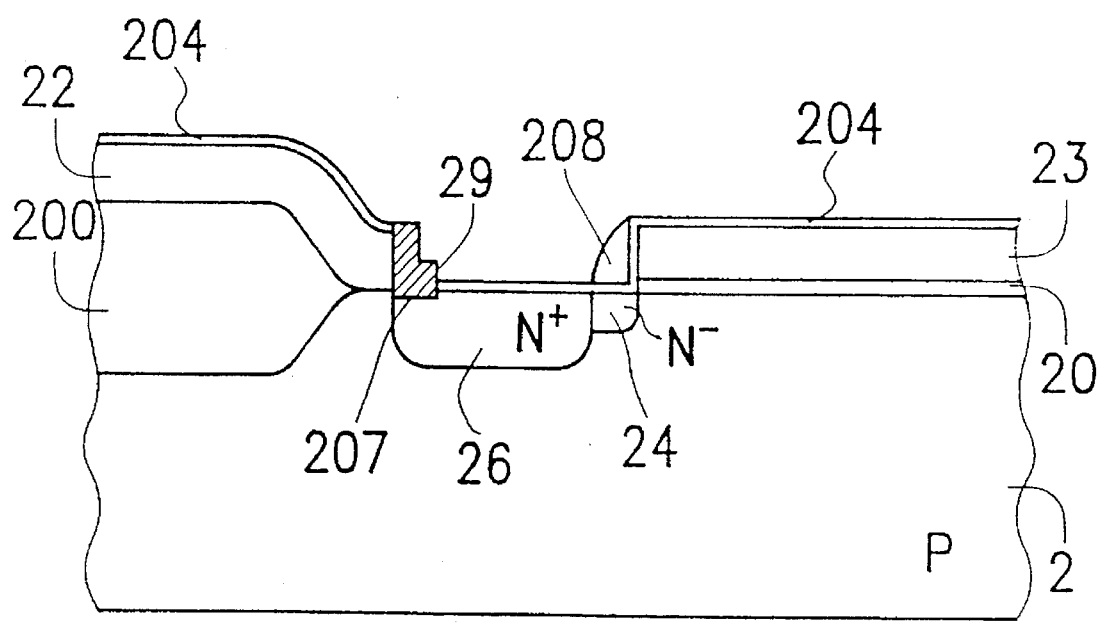

Finally referring to FIG. 2E, metal layer 28 is removed by chemical solution to finish the process. If metal layer 28 is a titanium layer, a mixture of $NH_4OH$ and $H_2O_2$ is usually used to attain this purpose.

As disclosed in the above preferred embodiment of the invention, a silicide layer is used to connect the buried contact region with the interconnect layer to thereby make electrical contact by the interconnect layer with source/drain regions. The limitation of design rules can be overcome. The dimensions of the buried contact region can be significantly scaled down. The disadvantages of forming a trench as discussed above can be eliminated.

What is claimed is:

1. A method of fabricating a buried contact structure in a silicon substrate doped with impurities of a first conductivity type and having an active region isolated by a field oxide layer, comprising the steps of:

(a) forming a gate oxide layer over said substrate;

(b) forming a polysilicon layer over said gate oxide layer and said field oxide layer;

(c) patterning and etching said polysilicon layer to form a gate electrode on said active region, an interconnect layer covering said field oxide layer, and an opening located between said gate electrode and said interconnect layer;

(d) forming an oxide layer covering said interconnect layer and sidewalls of said interconnect layer said gate electrode and sidewalls of said gate electrode and said opening;

(e) implanting impurities of a second conductivity type through said opening into said substrate to form a lightly-doped region beneath said opening;

(f) forming a first spacer on said oxide layer on the sidewall of said interconnect layer and a second spacer on said oxide layer on the sidewall of said gate electrode;

(g) removing said first spacer together with the underlying oxide layer to define a contact region adjacent to the sidewall of said interconnect layer and removing said oxide layer formed on the sidewall of said interconnect layer;

(h) implanting impurities of the second conductivity type through said opening into said substrate to form a heavily-doped region between said lightly-doped region and said field oxide layer including a portion beneath said contact region; and (i) forming a silicide layer on said sidewall of said interconnect layer and said contact region to make electrical contact between the interconnect layer and said heavily-doped region through said contact region.

2. The method of claim 1, further comprising the following step, between step (h) and step (i), of sputtering a metal layer on said oxide layer, the sidewall of said interconnect layer, and said contact region;

subjecting said metal layer contacting with said sidwall of said interconnect layer and the contact region to a thermal process to form said silicide layer;

removing said metal layer by using a chemical solution.

3. The method of claim 2, wherein said metal layer is titanium, said silicide layer is titanium silicide, and said chemical solution is a mixture of $NH_4OH$ and $H_2O_2$.

4. The method of claim 3, wherein the thickness of said metal layer ranges from 500Å to 1500Å.

5. The method of claim 1, further comprising a step, between step (b) and step (c), of forming a tungsten silicide layer on said polysilicon layer.

6. The method of claim 5, wherein the thickness of said oxide layer ranges from 50Å to 500Å.

7. The method of claim 1, wherein said first conductivity type is N-type, and said second conductivity type is P-type.

8. The method of claim 1, wherein said first conductivity type is P-type, and said second conductivity type is N-type.

\* \* \* \* \*